(12) United States Patent
Choi

(10) Patent No.: US 11,127,663 B2
(45) Date of Patent: Sep. 21, 2021

(54) SEMICONDUCTOR PACKAGE HAVING EXPOSED HEAT SINK FOR HIGH THERMAL CONDUCTIVITY

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

(*) Notice: Subject to any disclaimer, the term of this patent is extended or adjusted under 35 U.S.C. 154(b) by 0 days.

(21) Appl. No.: 16/912,724

(22) Filed: Jun. 26, 2020

(65) Prior Publication Data

US 2021/0057313 A1 Feb. 25, 2021

(30) Foreign Application Priority Data

Aug. 20, 2019 (KR) .......................... 10-2019-0101506

(51) Int. Cl.
*H01L 23/495* (2006.01)
*H01L 23/34* (2006.01)
(Continued)

(52) U.S. Cl.
CPC .... *H01L 23/49568* (2013.01); *H01L 21/4871* (2013.01); *H01L 23/31* (2013.01);
(Continued)

(58) Field of Classification Search
CPC ........... H01L 21/4871; H01L 23/49568; H01L 23/31; H01L 23/3677; H01L 23/49541;
(Continued)

(56) References Cited

U.S. PATENT DOCUMENTS

| 7,728,413 B2 * | 6/2010 | Iwade .................. H01L 23/051 |
| | | 257/675 |
| 10,249,552 B2 * | 4/2019 | Choi ...................... H01L 24/40 |
| (Continued) | | |

FOREIGN PATENT DOCUMENTS

| JP | 2008-141140 A | 6/2008 |
| JP | 2012-238737 A | 12/2012 |
| (Continued) | | |

*Primary Examiner* — Alonzo Chambliss
(74) *Attorney, Agent, or Firm* — Park, Kim & Suh, LLC

(57) ABSTRACT

Provided is a semiconductor package having an exposed heat sink for high thermal conductivity. The semiconductor package includes at least one semiconductor chip 110, the lead frame 120, a signal line 130, the sealing member 140, and at least one heat sink 150, wherein the lead frame 120 has a first surface, to which the semiconductor chips 110 are attached, and a second surface facing the first surface, the signal line 130 electrically connects the semiconductor chips 110 and the semiconductor chip 110 to the lead frame 120 by wire bonding or clip bonding, the sealing member 140 surrounds areas where the semiconductor chips 110 are attached, except for an external connection terminal 121 of the lead frame 120, and exposes the second surface of the lead frame 120, and the at least one heat sink 150 are attached to the second surface of the exposed lead frame 120. Here, spaces A and B are interposed between the sealing member 140 and the heat sink 150 which face each other, and the heat sink 150 is attached to the second surface of the lead frame 120 after molding of the sealing member 140. Accordingly, the sealing member 140 and the heat sink 150 may be prevented from being warped and thus, stress directly applied to the semiconductor chip 110 is removed. Therefore, reliability and electrical characteristics may be stably secured, and a terminal used in electrical connection may be easily secured through the lead frame 120 exposed to the outside of the sealing member 140.

21 Claims, 18 Drawing Sheets

(51) Int. Cl.
*H01L 21/00* (2006.01)
*H05K 7/20* (2006.01)
*H05K 7/18* (2006.01)
*H01L 23/367* (2006.01)
*H01L 23/31* (2006.01)
*H01L 21/48* (2006.01)
*H05K 1/02* (2006.01)

(52) U.S. Cl.
CPC ........ *H01L 23/315* (2013.01); *H01L 23/3677* (2013.01); *H01L 23/4952* (2013.01); *H01L 23/49541* (2013.01); *H05K 1/0203* (2013.01)

(58) Field of Classification Search
CPC .. H01L 23/4952; H01L 23/315; H05K 1/0203
See application file for complete search history.

(56) References Cited

U.S. PATENT DOCUMENTS

| | | | | |
|---|---|---|---|---|
| 2006/0108700 A1* | 5/2006 | Nakazawa | ............ | H01L 21/565 257/787 |
| 2010/0176498 A1* | 7/2010 | Lee | ............ | H01L 23/4334 257/675 |

FOREIGN PATENT DOCUMENTS

| | | | |
|---|---|---|---|
| KR | 10-2001-0111736 | A | 12/2001 |
| KR | 10-0867573 | B1 | 11/2008 |
| KR | 10-1222831 | B1 | 1/2013 |
| KR | 10-1899788 | B1 | 11/2018 |
| WO | 2012/011210 | A1 | 1/2012 |

\* cited by examiner

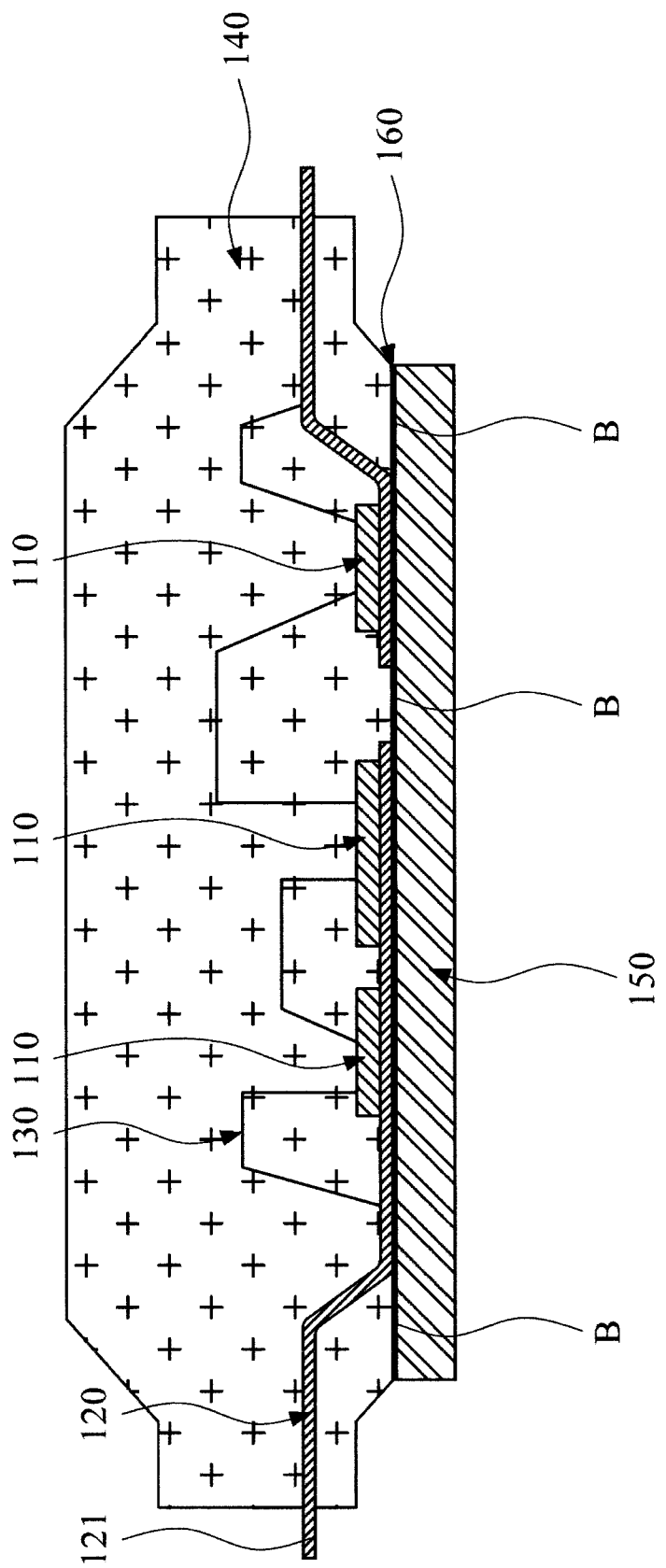

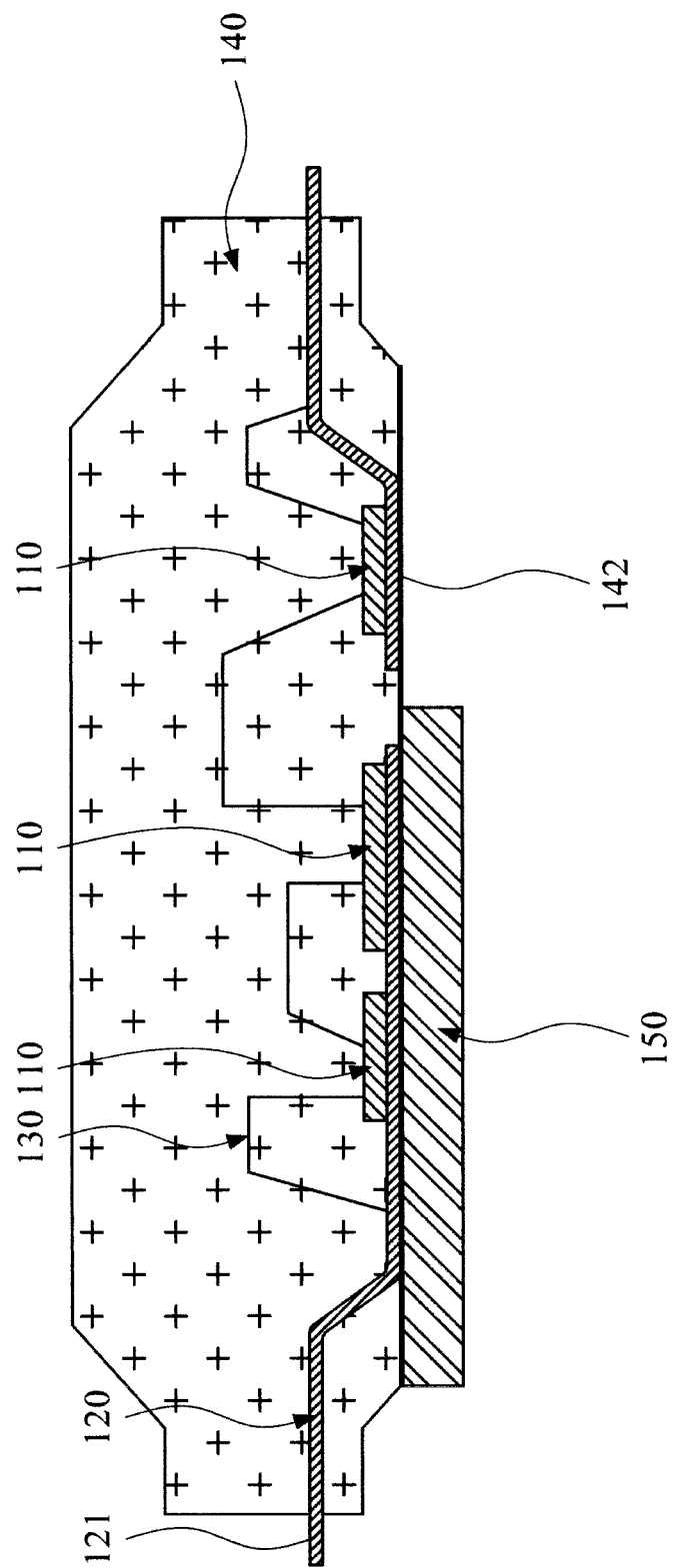

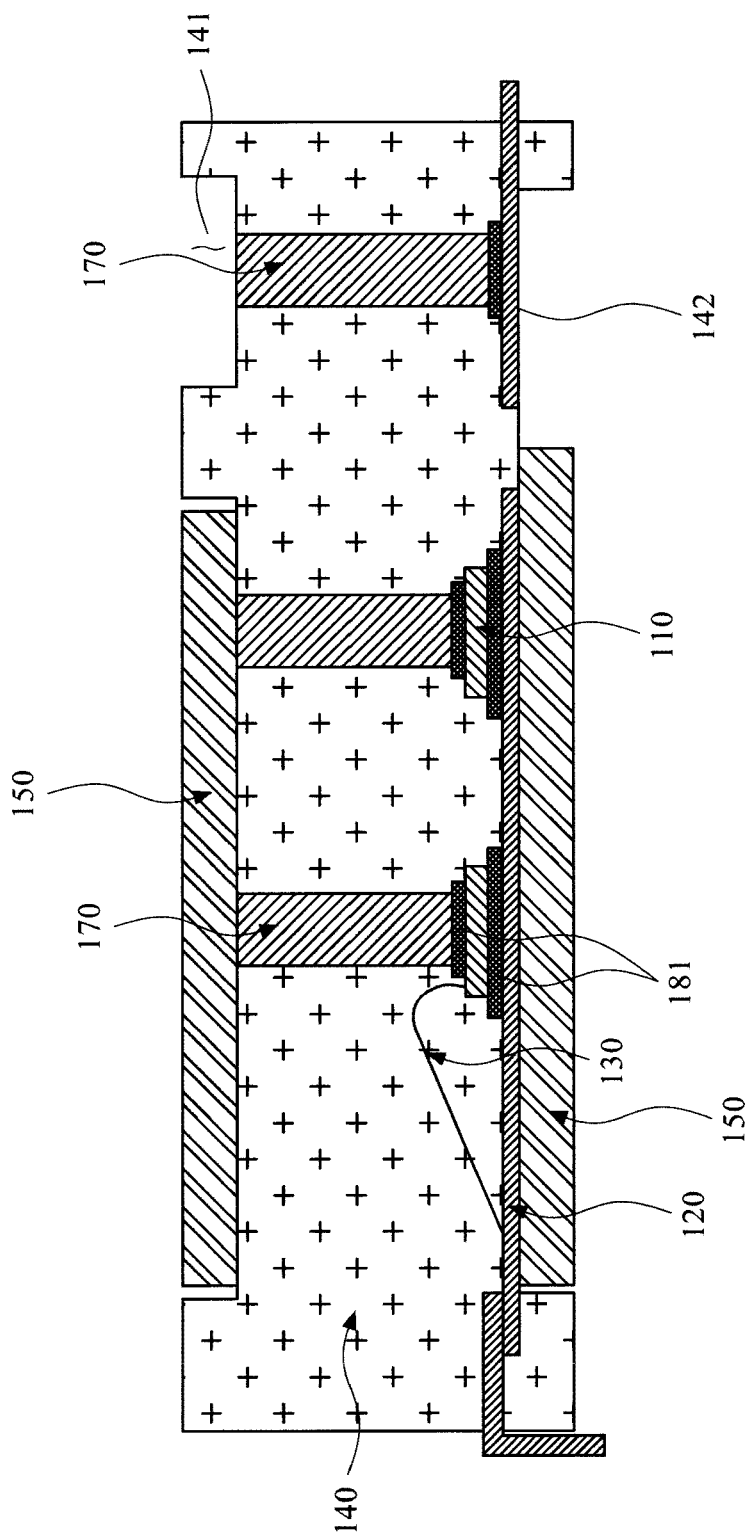

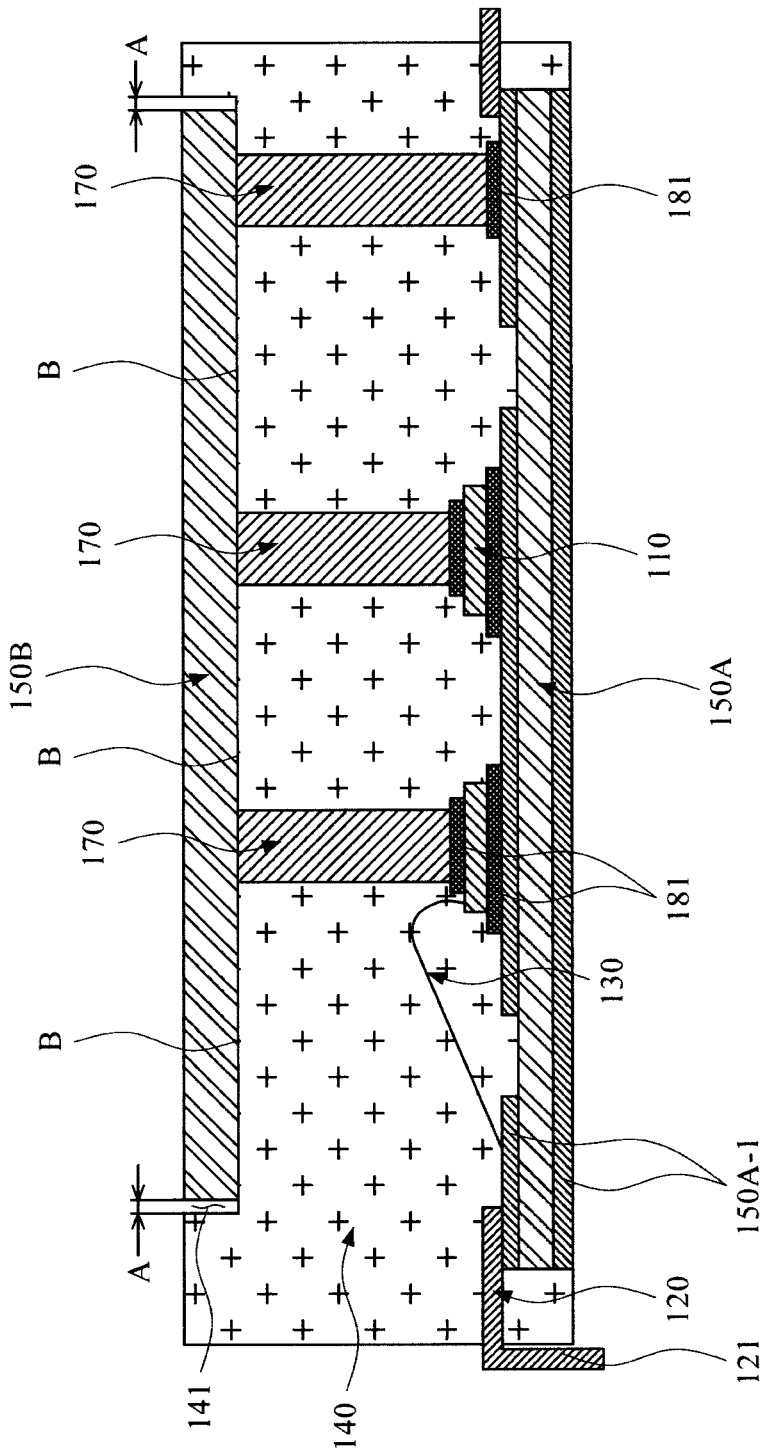

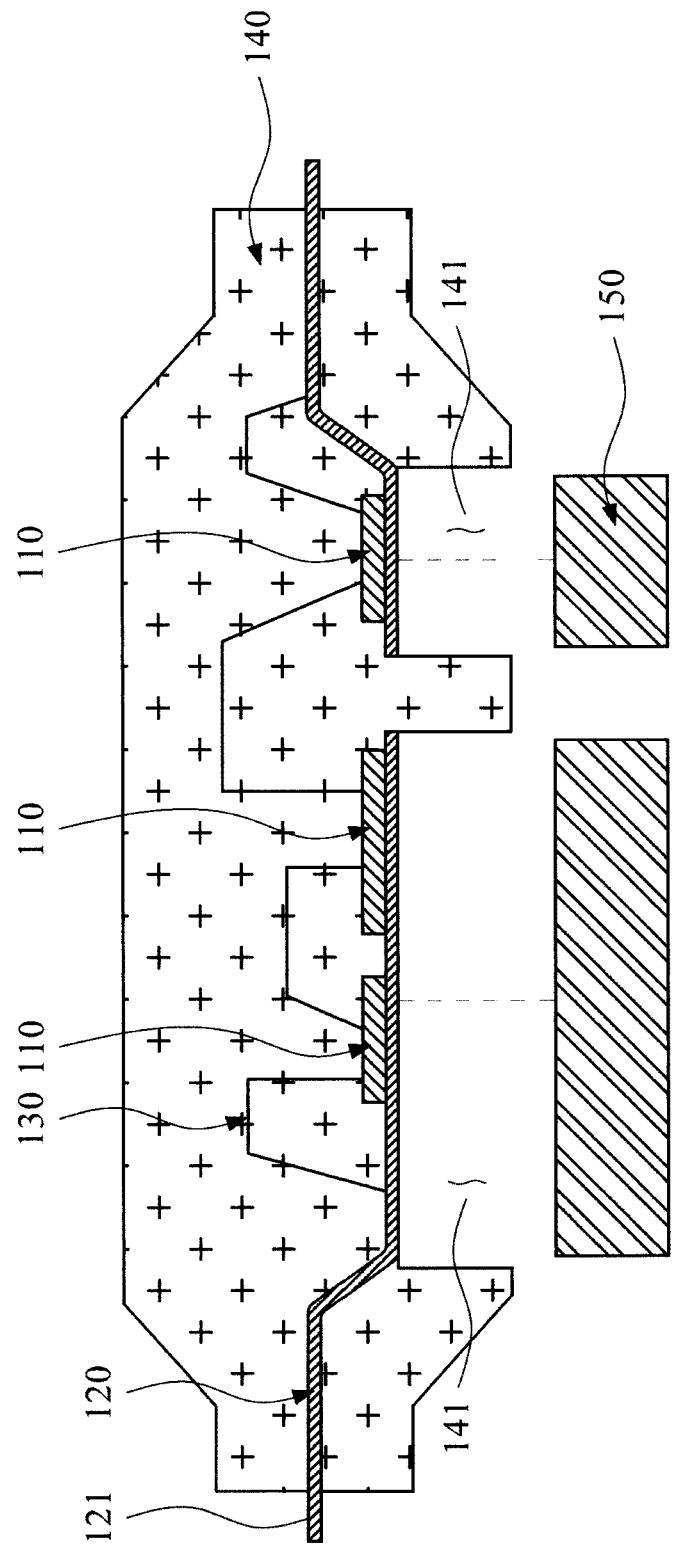

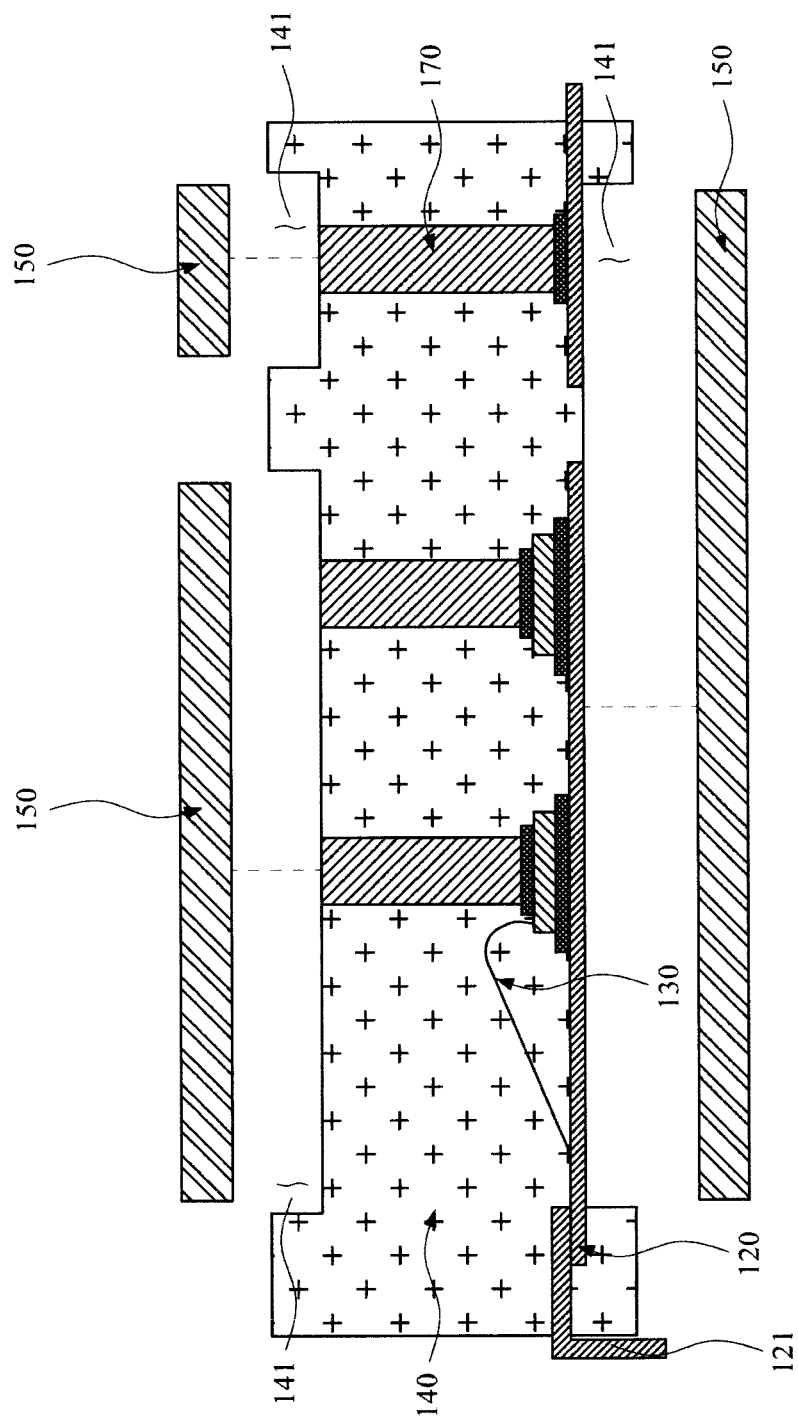

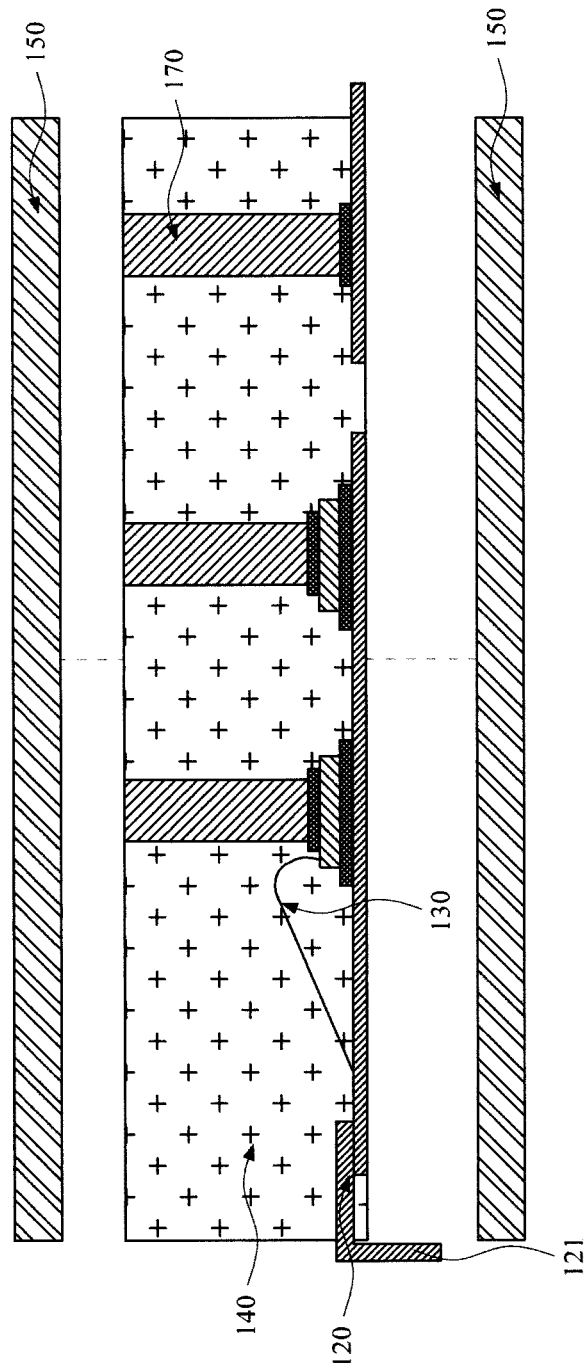

SEMICONDUCTOR PACKAGE HAVING EXPOSED HEAT SINK FOR HIGH THERMAL CONDUCTIVITY

CROSS-REFERENCE TO RELATED PATENT APPLICATION

This application claims the benefit of Korean Patent Application No. 10-2019-0101506, filed on Aug. 20, 2019, in the Korean Intellectual Property Office, the disclosure of which is incorporated herein in its entirety by reference.

BACKGROUND OF THE INVENTION

1. Field of the Invention

The present invention relates to a semiconductor package having an exposed heat sink, and more particularly, to a semiconductor package having an exposed heat sink for high thermal conductivity, wherein the heat sink is in a form of a board, is exposed to one side or both sides of upper and lower parts of the semiconductor package, and is attached after molding of a sealing member so that the semiconductor package may be prevented from being deformed and thereby, reliability and electrical characteristics may be stably secured.

2. Description of the Related Art

As illustrated in FIG. 1A, a general semiconductor package includes at least one semiconductor chip 10 on a pad of a lead frame 20 or on a metal insulator board 30 including a metal pattern layer 31, wherein the semiconductor chip 10 and the lead frame 20 are electrically connected through a signal line 40 and a sealing member 50 is molded to have a cross-section exposed heat sink. Accordingly, heat generated from the semiconductor chip 10 is discharged to the outside through the metal insulator board 30, which is a heat sink.

In addition, as illustrated in FIG. 1B, at least one semiconductor chip 10 is attached on a pad of the lead frame 20 or is interposed between the metal insulator board 30 including the metal pattern layer 31 and a metal post 60 by using an adhesive 61. Here, the metal insulator board 30 is exposed to both sides, the semiconductor chip 10 and the lead frame 20 are electrically connected through the signal line 40, the sealing member 50 is molded to have a both-sides exposed heat sink. Accordingly, heat generated from the semiconductor chip 10 is discharged to the outside through the metal insulator board 30, which is a heat sink.

However, in the above-mentioned general semiconductor package, the semiconductor package may be bent or warped after molding is completed due to difference in a Coefficient of Thermal Expansion (CTE) of a sealing member, a heat sink, or an insulator board in the above-mentioned general semiconductor package and thus, a semiconductor chip included in the sealing member is under stress. Accordingly, reliability and electrical characteristics may be lowered.

Therefore, technologies to increase heat generation effect by a heat sink and to prevent deformation of a semiconductor package are required.

SUMMARY OF THE INVENTION

The present invention provides a semiconductor package having an exposed heat sink for high thermal conductivity, wherein the heat sink is in a form of a board, is exposed to one side or both sides of upper and lower parts of the semiconductor package, and is attached after molding of a sealing member so that the semiconductor package may be prevented from being deformed and thereby, reliability and electrical characteristics may be stably secured.

According to an aspect of the present invention, there is provided a semiconductor package having an exposed heat sink for high thermal conductivity including: at least one semiconductor chip; a lead frame comprising a first surface, to which the semiconductor chips are attached, and a second surface facing the first surface; a signal line for electrically connecting the semiconductor chips and the semiconductor chip to the lead frame; a sealing member for surrounding areas where the semiconductor chips are attached, except for an external connection terminal of the lead frame, so that the second surface of the lead frame is exposed; and at least one heat sink attached to the second surface of the lead frame, wherein the sealing member and the heat sink comprise a space interposed therebetween and the heat sink is attached to the second surface of the lead frame after molding of the sealing member.

Here, the heat sink may be an insulator board, a conductive board including 50% or more metal components, a conductive or non-conductive tape form, or a paste form to be cured at high temperature of above 100° C. and hardened.

The heat sink may include an adhesive so as to be attached to the lead frame.

The second surface of the lead frame may be partially exposed through a groove of the sealing member or formed to be exposed to the entire sealing member and then, the heat sink may be attached to the second surface of the lead frame.

The second surface of the lead frame may be partially exposed at one side of the sealing member in a hollow form.

The heat sink may include a plated layer on the surface thereof, and the plated layer may be attached to the second surface of the lead frame by soldering or sintering.

A distance of the space interposed between an inner wall of the groove of the sealing member and the heat sink may be 10 μm to 5 mm, a distance of the space interposed between the entire sealing member and the heat sink may be 1 μm to 1 mm, and the spaces may be filled with an insulated material or an uninsulated material.

According to another aspect of the present invention, there is provided a semiconductor package having an exposed heat sink for high thermal conductivity including: at least one semiconductor chip; a lead frame comprising a first surface, to which the semiconductor chips are attached, and a second surface facing the first surface; at least one metal post attached on the semiconductor chips for electrical connection; a signal line for electrically connecting the semiconductor chip to the lead frame; a sealing member for surrounding areas where the semiconductor chips are attached, except for an external connection terminal of the lead frame, so that the second surface of the lead frame and the upper surface of the metal post are exposed; and at least one heat sink, wherein both sides thereof are respectively attached to the second surface of the lead frame and the upper surface of the metal post, wherein the sealing member and the heat sink comprise a space interposed therebetween and the heat sink is respectively attached to the second surface of the lead frame and the upper surface of the metal post after molding of the sealing member.

Here, the heat sink may be an insulator board, a conductive board including 50% or more metal components, a conductive or non-conductive tape form, or a paste form to be cured at high temperature of above 100° C. and hardened.

The heat sink may include an adhesive so as to be respectively attached to the lead frame and the metal post.

The second surface of the lead frame and the upper surface of the metal post may be partially exposed through a groove of the sealing member or formed to be exposed to the entire sealing member and then, the heat sink may be attached to the second surface of the lead frame and the upper surface of the metal post.

The second surface of the lead frame may be partially exposed at one side of the sealing member in a hollow form.

The upper surfaces of the at least one metal post may be partially exposed to one side of the sealing member.

The heat sink may include a plated layer on the surface thereof, and the plated layer may be attached to the second surface of the lead frame and the upper surface of the metal post by soldering or sintering.

According to another aspect of the present invention, there is provided a semiconductor package having an exposed heat sink for high thermal conductivity including: at least one semiconductor chip; a first heat sink comprising a first surface, to which the semiconductor chips are attached, and a second surface facing the first surface; a lead frame connected to the first heat sink; at least one metal post attached on the semiconductor chips for electrical connection; a signal line for electrically connecting the semiconductor chip to the lead frame; a sealing member for surrounding areas excluding the first heat sink, on which the semiconductor chip is attached, and an external connection terminal of the lead frame so that the upper surface of the lead frame is exposed; and at least one second heat sink attached to the upper surface of the metal post, wherein the sealing member and the second heat sink comprise a space interposed therebetween so as to face each other, the first heat sink is attached to the semiconductor chip before molding of the sealing member, and the second heat sink is attached to the upper surface of the metal post after molding of the sealing member.

Here, the first and second heat sinks may be respectively an insulator board, a conductive board comprising 50% or more metal components, a conductive or non-conductive tape form, or a paste form to be cured at high temperature of above 100° C. and hardened.

The first and second heat sinks may include an adhesive so as to be attached to the metal post and the semiconductor chip.

The upper surface of the metal post may be partially exposed through a groove of the sealing member or formed to be exposed to the entire sealing member and then, the second heat sink may be attached to the upper surface of the metal post.

The upper surfaces of the at least one metal post may be partially exposed to one side of the sealing member.

A distance of the space interposed between an inner wall of the groove of the sealing member and the heat sink may be 10 µm to 5 mm, a distance of the space interposed between the entire sealing member and the heat sink may be 1 µm to 1 mm, and the spaces may be filled with an insulated material or an uninsulated material.

A distance of the space interposed between an inner wall of the groove of the sealing member and the second heat sink may be 10 µm to 5 mm, a distance of the space interposed between the entire sealing member and the second heat sink may be 1 µm to 1 mm, and the spaces may be filled with an insulated material or an uninsulated material.

BRIEF DESCRIPTION OF THE DRAWINGS

The above and other features and advantages of the present invention will become more apparent by describing in detail exemplary embodiments thereof with reference to the attached drawings in which:

FIGS. 2A, 2B, 3A and 3B are cross-sectional views of a semiconductor package having an exposed heat sink for high thermal conductivity according to an embodiment of the present invention;

FIGS. 4A, 4B, 4C, 5A and 5B are cross-sectional views of a semiconductor package having an exposed heat sink for high thermal conductivity according to another embodiment of the present invention;

FIG. 6 is a cross-sectional view of a semiconductor package having an exposed heat sink for high thermal conductivity according to another embodiment of the present invention;

FIGS. 7A and 7B illustrate a method (fourth embodiment) of manufacturing a semiconductor package having an exposed heat sink for high thermal conductivity according to another embodiment of the present invention;

FIGS. 8A and 8B illustrate a method (fifth embodiment) of manufacturing a semiconductor package having an exposed heat sink for high thermal conductivity according to another embodiment of the present invention.

DETAILED DESCRIPTION OF THE INVENTION

Figure 1A:
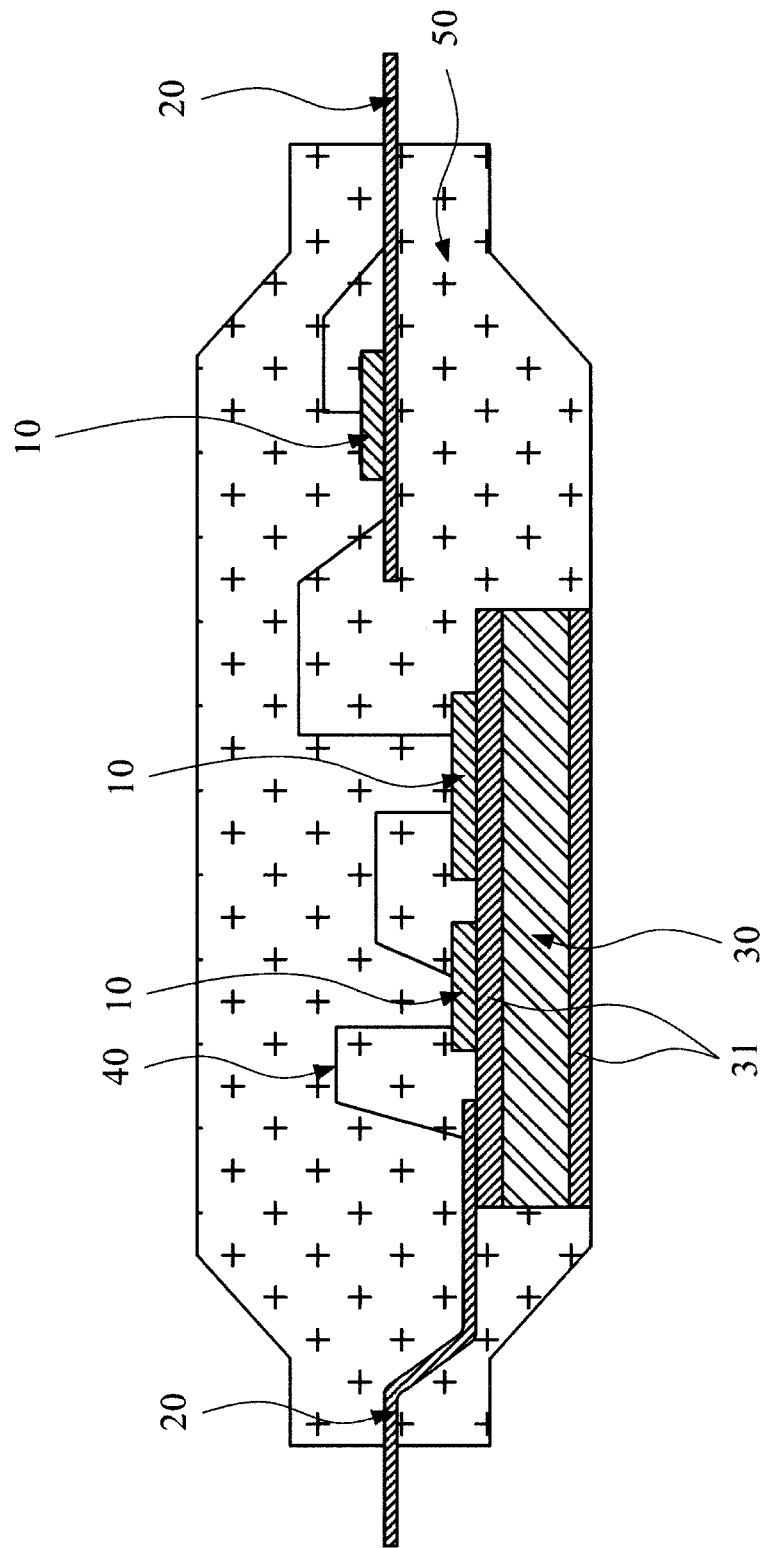
FIGS. 1A and 1B illustrate a conventional semiconductor package structure in an exposed type.
Figure 1B:
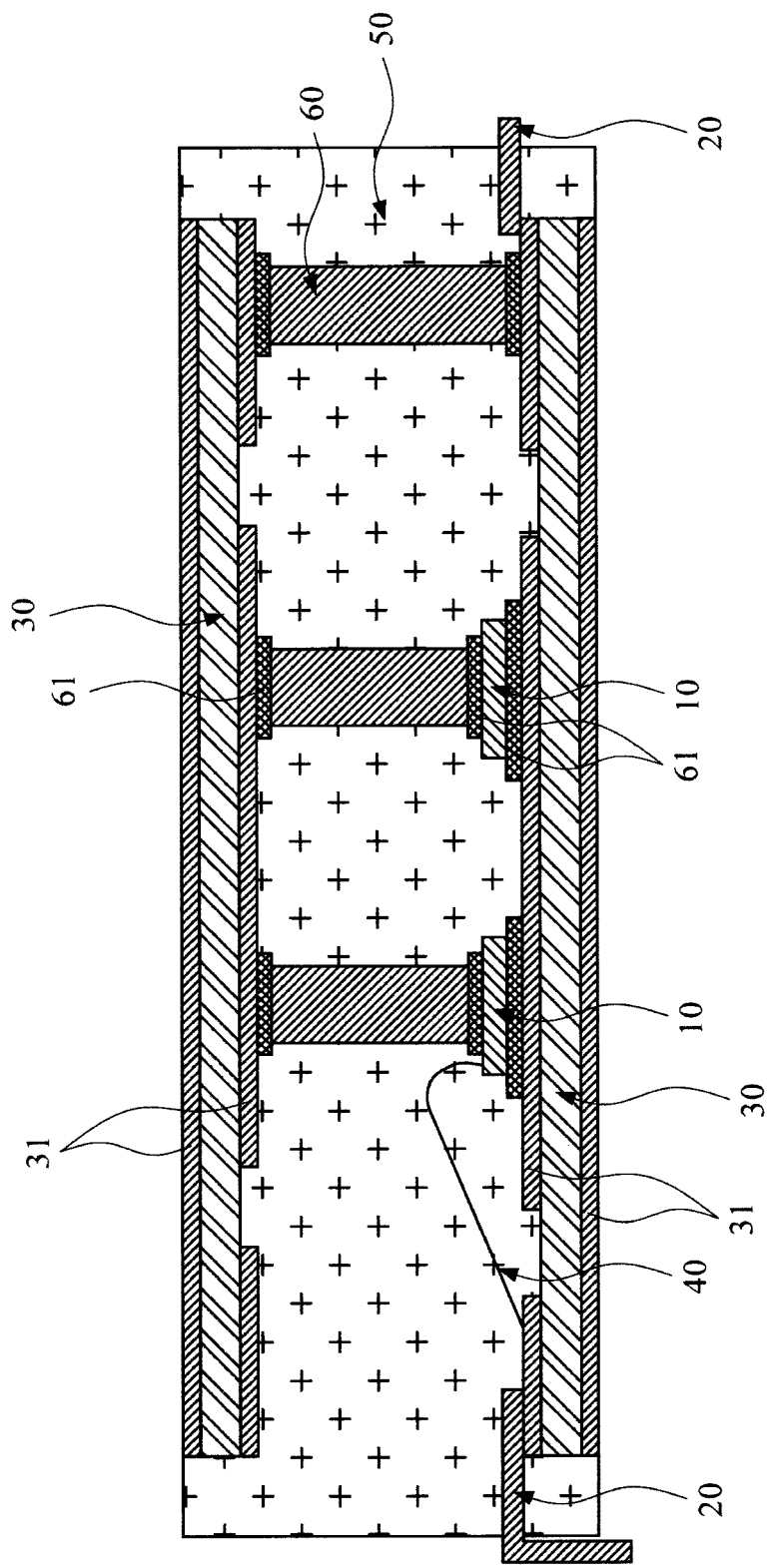

Hereinafter, the present invention will be described in more detail with reference to the accompanying drawings to be easily implemented by those of ordinary skill in the art. This invention may, however, may be embodied in many alternate forms and should not be construed as limited to only the exemplary embodiments set forth herein.

Firstly, an embodiment of the present invention is related to a semiconductor package having an exposed heat sink for high thermal conductivity in which a sealing member 140 is molded and then, a heat sink 150 having a cross-section exposed structure is attached to a lead frame 120.

That is, referring to FIGS. 2A, 2B, 3A and 3B, the semiconductor package having an exposed heat sink for high thermal conductivity according to an embodiment of the present invention includes at least one semiconductor chip 110, the lead frame 120, a signal line 130, the sealing member 140, and at least one heat sink 150, wherein the lead frame 120 has a first surface, to which the semiconductor chips 110 are attached, and a second surface facing the first surface, the signal line 130 electrically connects the semiconductor chips 110 and the semiconductor chip 110 to the lead frame 120 by wire bonding or clip bonding, the sealing member 140 surrounds areas where the semiconductor chips 110 are attached, except for an external connection terminal 121 of the lead frame 120, and exposes the second surface of the lead frame 120, and the at least one heat sink 150 are attached to the second surface of the exposed lead frame 120. Here, spaces A and B are interposed between the sealing member 140 and the heat sink 150 which face each other, and the heat sink 150 is attached to the second surface of the lead frame 120 after molding of the sealing member 140. Accordingly, the sealing member 140 and the heat sink 150 may be prevented from being warped and thus, stress directly applied to the semiconductor chip 110 is removed. Therefore, reliability and electrical characteristics may be stably secured, and a terminal used in electrical connection may be easily secured through the lead frame 120 exposed to the outside of the sealing member 140.

Here, the semiconductor chips 110 are attached on a pad of the lead frame 120 and may include a silicon controlled rectifier (SCR), a power transistor, an insulated gate bipolar transistor (IGBT), a metal-oxide semiconductor filed effect transistor (MOSFET), a power rectifier, a power regulator, or a power semiconductor including a combination thereof.

Also, the sealing member 140 is an insulator for protecting a semiconductor circuit and may include an epoxy molding compound (EMC), polyphenylene sulfide (PPS), or polybutylene terephthalate (PBT).

In addition, the heat sink 150 may be an insulator board having a thickness of 0.1 mm to 5 mm, wherein the insulator board may have a single-layer or may be a metal insulator board having multi-layers, on which one or more metal pattern layers are formed.

Moreover, the heat sink 150 may be a conductive board including 50% or more metal components.

Furthermore, the heat sink 150 may be formed as a conductive or non-conductive tape form or a paste form to be cured at high temperature of above 100° C. and hardened.

Figure 2A:
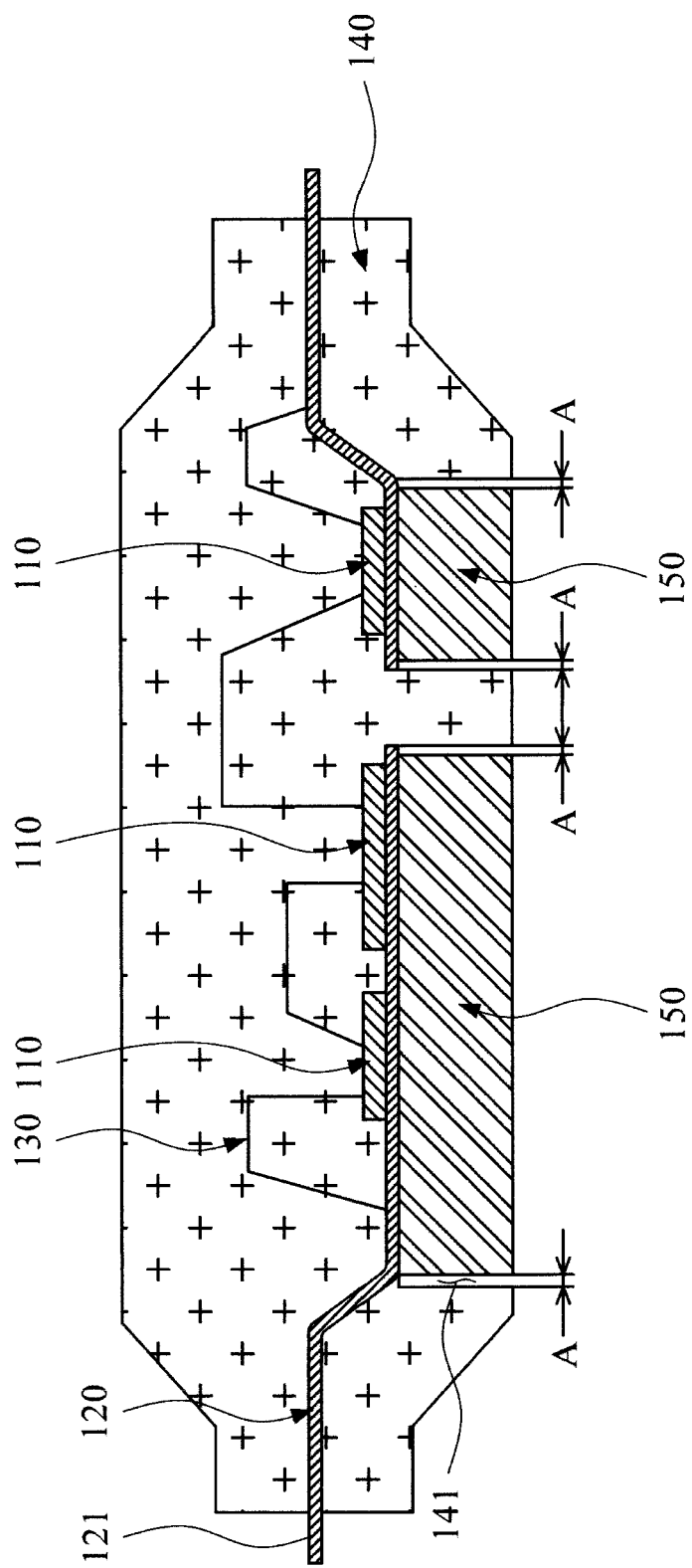

As illustrated in FIG. 2A, the heat sink 150 may be directly attached on the pad of the lead frame 120. Here, the second surface of the lead frame 120 is partially exposed through a groove 141 (refer to FIG. 7A) of the sealing member 140 and then, the heat sink 150 may be attached to the second surface of the lead frame 120.

Here, a distance of the space A interposed between an inner wall of the groove 141 of the sealing member 140 and the heat sink 150 is formed to be 10 μm to 5 mm and thus, warpage occurring in the sealing member 140 and the heat sink 150 due to a difference in a Coefficient of Thermal Expansion (CTE) may be prevented. Accordingly, stress directly applied to the semiconductor chip 110 may be removed.

Also, as illustrated in FIG. 2B, the heat sink 150 may be attached on the pad of the lead frame 120 by using an adhesive 160 interposed therebetween. The second surface of the lead frame 120 is formed to be exposed to the entire sealing member 140 and then, the heat sink 150 is attached to the second surface. Then, the space B is formed between the sealing member 140, where the pad of the lead frame 120 is not formed, and the heat sink 150 due to a thickness of the adhesive 160 and thus, warpage occurring in the sealing member 140 and the heat sink 150 due to a difference in a CTE may be prevented. Accordingly, stress directly applied to the semiconductor chip 110 may be removed.

Here, the adhesive 160 may be conductive or non-conductive and may include any one of Al2O3, AlN, and Si3N4, or Pl.

Also, a distance B of the space B interposed between the entire sealing member 140 and the heat sink 150 may be 1 μm to 1 mm.

In addition, instead of the adhesive 160, a plated layer (not illustrated) may be formed on the surface of the heat sink 150 and the plated layer is attached to the second surface of the lead frame 120 by soldering or sintering. Then, the space B is formed between the sealing member 140, where the pad of the lead frame 120 is not formed, and the heat sink 150 due to a thickness of the plated layer and thus, warpage occurring in the sealing member 140 and the heat sink 150 due to a difference in a CTE may be prevented. Accordingly, stress directly applied to the semiconductor chip 110 may be removed.

Figure 3A:
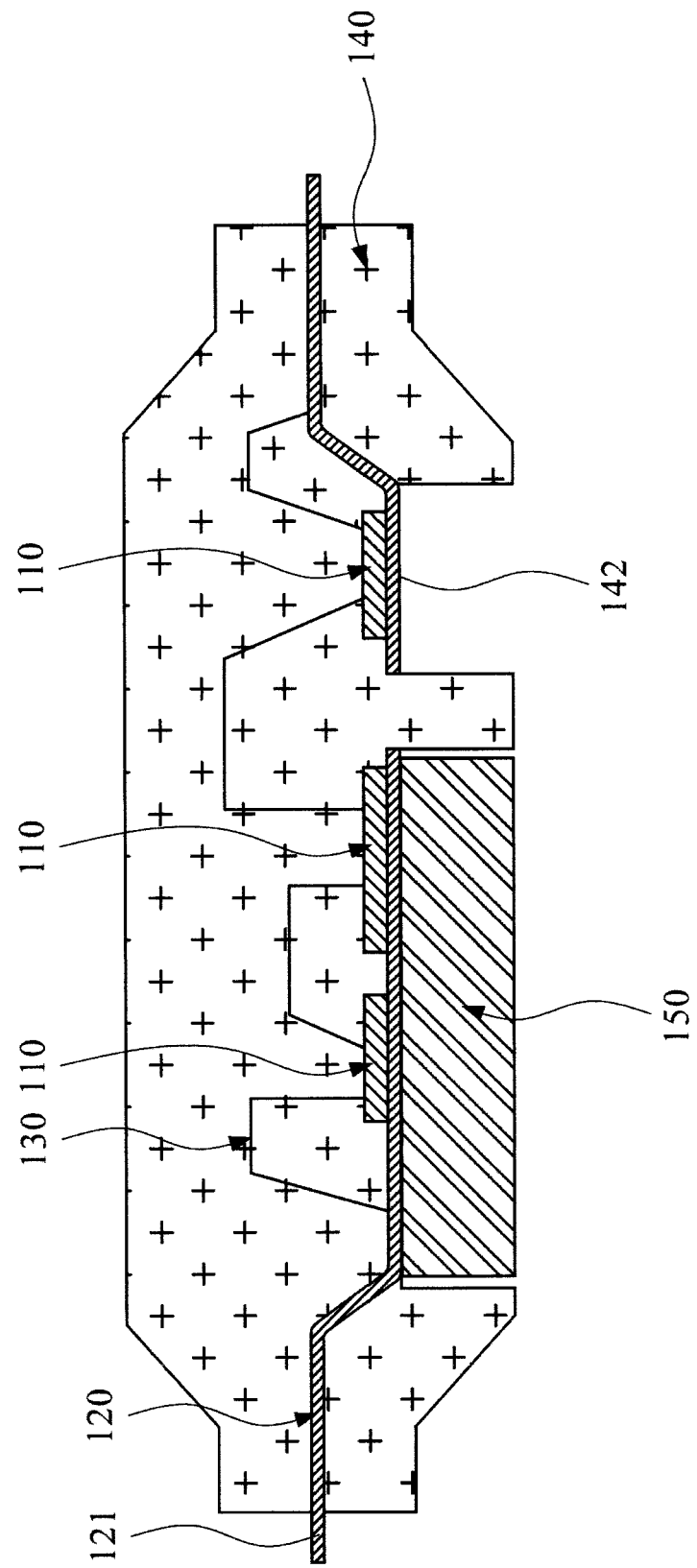

As illustrated in FIGS. 3A and 3B, a part 142 of the second surface of the lead frame 120 is partially exposed at one side of the sealing member 140 in a hollow form and thus, a terminal used in electrical connection may be easily secured through the exposed lead frame 140 without the heat sink 150.

The spaces A and B may be filled with an insulated material or an uninsulated material.

Next, another embodiment of the present invention is related to a semiconductor package having an exposed heat sink for high thermal conductivity in which the sealing member 140 is molded and then, the heat sink 150 having a both-sides exposed structure is attached to the lead frame 120 and a metal post 170.

That is, referring to FIGS. 4A, 4B, 4C, 5A and 5B, the semiconductor package having an exposed heat sink for high thermal conductivity according to another embodiment of the present invention includes at least one semiconductor chip 110, the lead frame 120, at least one metal post 170, the signal line 130, the sealing member 140, and at least one heat sink 150, wherein the lead frame 120 has the first surface, to which the semiconductor chips 110 are attached, and the second surface facing the first surface, the at least one metal post 170 is attached on the semiconductor chips 110 for electrical connection, the signal line 130 electrically connects the semiconductor chips 110 and the semiconductor chip 110 to the lead frame 120 by wire bonding or clip bonding, the sealing member 140 surrounds areas where the semiconductor chips 110 are attached, except for the external connection terminal 121 of the lead frame 120, and exposes the second surface of the lead frame 120 and upper surfaces of the metal posts 170, and both sides of the heat sink 150 are respectively attached to the second surface of the lead frame 120 and the upper surface of the metal post 170. Here, the spaces A and B are interposed between the sealing member 140 and the heat sink 150 which face each other, and the heat sink 150 is respectively attached to the second surface of the lead frame 120 and the upper surface of the metal post 170 after molding of the sealing member 140. Accordingly, the sealing member 140 and the heat sink 150 may be prevented from being warped and thus, stress directly applied to the semiconductor chip 110 is removed. Therefore, reliability and electrical characteristics may be stably secured, and a terminal used in electrical connection may be easily secured through the lead frame 120 exposed to the outside of the sealing member 140.

Here, the semiconductor chips 110 are attached between the pad of the lead frame 120 and the metal post 170 by using a conductive or non-conductive adhesive 181 interposed therebetween and may include a silicon controlled rectifier (SCR), a power transistor, an insulated gate bipolar transistor (IGBT), a metal-oxide semiconductor filed effect transistor (MOSFET), a power rectifier, a power regulator, or a power semiconductor including a combination thereof.

Also, the sealing member 140 is an insulator for protecting a semiconductor circuit and may include an EMC, PPS, or PBT.

In addition, the heat sink 150 may be an insulator board having a thickness of 0.1 mm to 5 mm, wherein the insulator board may have a single-layer or may be a metal insulator board having multi-layers, on which one or more metal pattern layers are formed.

Moreover, the heat sink 150 may be a conductive board including 50% or more metal components.

Furthermore, the heat sink 150 may be formed as a conductive or non-conductive tape form or a paste form to be cured at high temperature of above 100° C. and hardened.

Figure 4A:
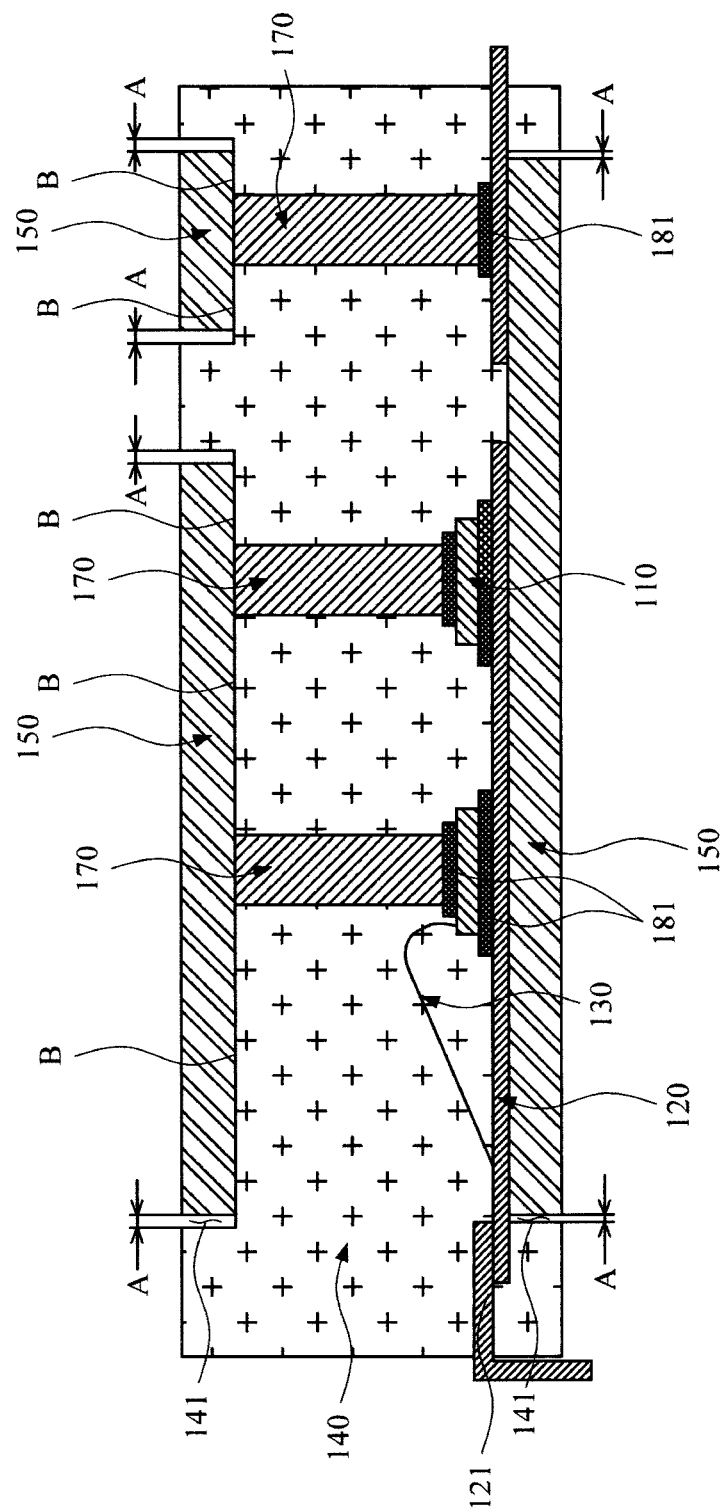

As illustrated in FIG. 4A, the heat sink 150 may be directly attached on the pad of the lead frame 120 and the upper surface of the metal post 170. Here, the second surface of the lead frame 120 and the upper surface of the metal post 170 are partially exposed through the groove 141 (refer to FIG. 8A) of the sealing member 140 and then, the heat sink 150 may be attached to the second surface of the lead frame 120 and the upper surface of the metal post 170.

Here, a distance of the space A interposed between an inner wall of the groove 141 of the sealing member 140 and the heat sink 150 is formed to be 10 μm to 5 mm and a distance of the space B interposed between the entire sealing member 140 and the heat sink 150, where the metal post 170 is not formed, is formed to be 1 μm to 1 mm.

Thus, warpage occurring in the sealing member 140 and the heat sink 150 due to a difference in a CTE may be prevented and stress directly applied to the semiconductor chip 110 may be removed.

Figure 4B:
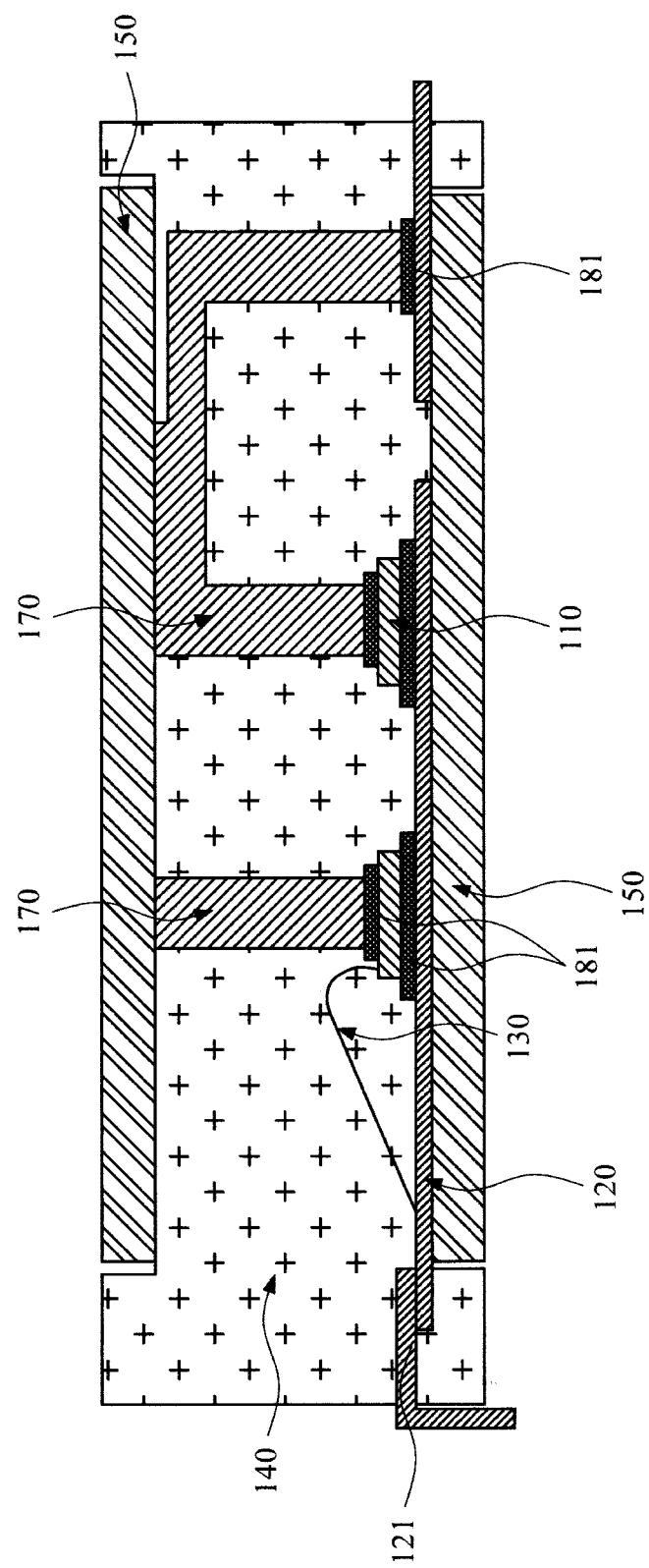
Figure 4C:
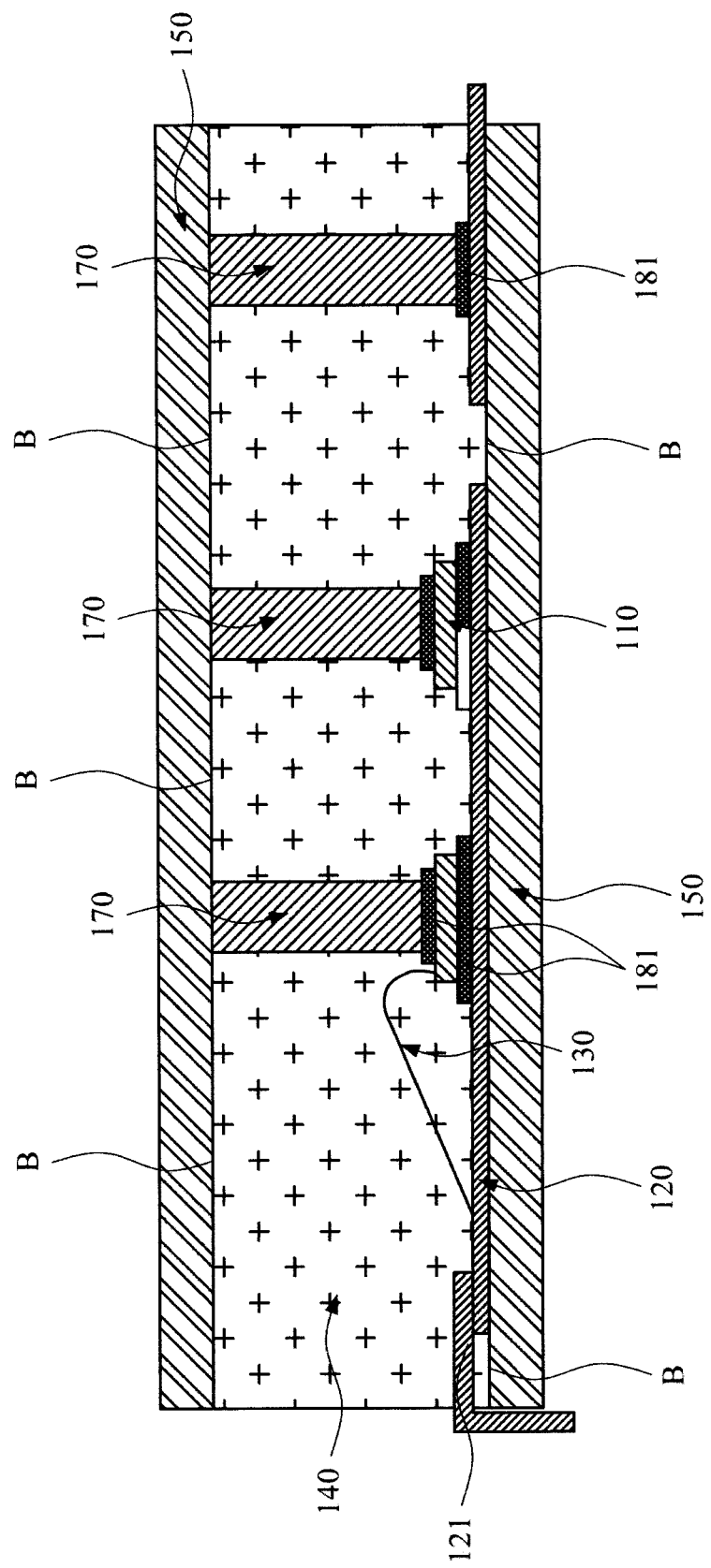

Also, as illustrated in FIG. 4C, the heat sink 150 may be attached on the pad of the lead frame 120 and the upper surface of the metal post 170 by using an adhesive (not illustrated) interposed therebetween. The second surface of the lead frame 120 and the upper surface of the metal post 170 are formed to be exposed to the entire sealing member 140 and then, the heat sink 150 is attached to the second surface and the upper surface. Then, the space B is formed between the sealing member 140, where the pad of the lead frame 120 and the metal post 170 are not formed, and the heat sink 150 due to a thickness of the adhesive 160 and thus, warpage occurring in the sealing member 140 and the heat sink 150 due to a difference in a CTE may be prevented. Accordingly, stress directly applied to the semiconductor chip 110 may be removed.

That is, the upper surface of the metal post 170 is formed to be partially exposed through the groove 141 of the sealing member 140 and then, the heat sink 150 may be attached to the upper surface of the metal post 170 (FIGS. 4A and 4B). Also, the upper surface of the metal post 170 is formed to be exposed to the entire sealing member 140 and then, the heat sink 150 may be attached to the upper surface of the metal post 170 (FIG. 4C).

Here, the adhesive 160 may be conductive or non-conductive and may include any one of Al2O3, AlN, and Si3N4, or Pl.

Also, a distance B of the space B interposed between the entire sealing member 140 and the heat sink 150 may be 1 μm to 1 mm.

In addition, instead of the adhesive 160, a plated layer (not illustrated) may be formed on the surface of the heat sink 150 and the plated layer is attached to the second surface of the lead frame 120 and the upper surface of the metal post 170 by soldering or sintering. Then, the space B is formed between the pad of the lead frame 120, the entire sealing member 140, and the heat sink 150, where the metal post 170 is not formed, due to a thickness of the plated layer, and thus, warpage occurring in the sealing member 140 and the heat sink 150 due to a difference in a CTE may be prevented. Accordingly, stress directly applied to the semiconductor chip 110 may be removed.

Figure 5B:
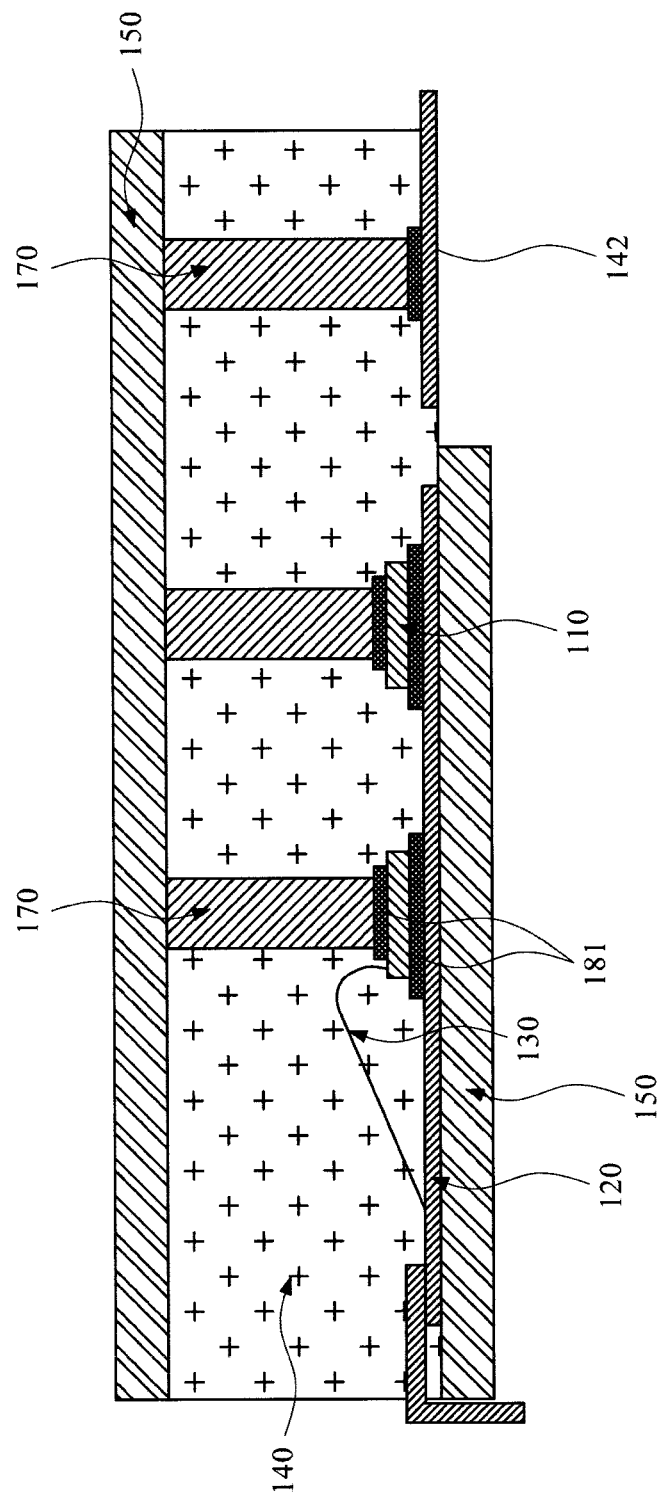

Moreover, as illustrated in FIGS. 5A and 5B, the part 142 of the second surface of the lead frame 120 is formed on one side of the sealing member 140 to be exposed in a hollow form or the upper surface of at least one metal post 170 is partially formed to be exposed in a hollow form through the groove 141 toward one side of the sealing member 140. Thus, a terminal used in electrical connection may be easily secured through the exposed lead frame 140 and the metal post 170 without the heat sink 150.

Furthermore, as illustrated in FIG. 4B, the heat sink 150 may be attached to the straight metal post 170 or the upper surface of the metal post 170 bent in a '⊏' form.

As described above, the spaces A and B may be filled with an insulated material or an uninsulated material.

Next, another embodiment of the present invention is related to a semiconductor package having an exposed heat sink for high thermal conductivity in which a first heat sink 150a is formed before molding of the sealing member 140 and a second heat sink 150b is formed after molding of the sealing member 140 so that the first and second heat sinks 150A and 150B having a both-sides exposed structure are attached to the lead frame 120 and the metal post 170.

That is, referring to FIG. 6, the semiconductor package having an exposed heat sink for high thermal conductivity according to another embodiment of the present invention includes at least one semiconductor chip 110, the first heat sink 150a, the lead frame 120, at least one metal post 170, the signal line 130, the sealing member 140, and at least one second heat sink 150b, wherein the first heat sink 150a has the first surface, to which the semiconductor chips 110 are attached, and the second surface facing the first surface, the lead frame 120 is connected to the first heat sink 150a, the at least one metal post 170 is attached on the semiconductor chip 110 for electrical connection, the signal line 130 electrically connects the semiconductor chip 110 and the lead frame 120, the sealing member 140 surrounds areas excluding the first heat sink 150a, on which the semiconductor chip 110 is attached, and the external connection terminal 121 of the lead frame 120 and exposes the upper surfaces of the metal posts 170, and the at least one second heat sink 150b is attached on the upper surfaces of the metal posts 170. Here, the spaces A and B are interposed between the sealing member 140 and the second heat sink 150b which face each other, the first heat sink 150a is attached to the semiconductor chip 110 before molding of the sealing member 140, and the second heat sink 150b is attached to the upper surface of the metal post 170 after molding of the sealing member 140. Accordingly, the sealing member 140 and the second heat sink 150b may be prevented from being warped and thus, stress directly applied to the semiconductor chip 110 is removed. Therefore, reliability and electrical characteristics may be stably secured, a terminal used in electrical connection may be easily secured through the lead frame 120 exposed to the outside of the sealing member 140, and inspection on defects may be available through scanning of the semiconductor package before attaching the second heat sink 150b after molding.

Here, the semiconductor chips 110 are attached between the pad of the lead frame 120 and the metal post 170 by using the conductive or non-conductive adhesive 181 interposed therebetween and may include a silicon controlled rectifier (SCR), a power transistor, an insulated gate bipolar transistor (IGBT), a metal-oxide semiconductor filed effect transistor (MOSFET), a power rectifier, a power regulator, or a power semiconductor including a combination thereof.

Also, the sealing member 140 is an insulator for protecting a semiconductor circuit and may include an EMC, PPS, or PBT.

In addition, the first and second heat sinks 150a and 150b may be respectively an insulator board having a thickness of 0.1 mm to 5 mm, wherein the insulator board may have a single-layer or may be a metal insulator board having multi-layers, on which one or more metal pattern layers 150a-1 are formed.

Moreover, the first and second heat sinks 150a and 150b may be a conductive board including 50% or more metal components.

Furthermore, the first and second heat sinks 150a and 150b may be formed as a conductive or non-conductive tape form or a paste form to be cured at high temperature of above 100° C. and hardened.

The second heat sink 150b may be directly attached to the upper surface of the corresponding metal post 170, wherein the upper surface of the metal post 170 is formed to be exposed through the groove 141 (refer to FIG. 9A) of the sealing member 140 and then, the second heat sink 150b may be attached to the upper surface of the metal post 170.

Here, a distance of the space A interposed between an inner wall of the groove 141 of the sealing member 140 and the second heat sink 150b is formed to be 10 μm to 5 mm and a distance of the space B interposed between the entire sealing member 140 and the second heat sink 150b, where the metal post 170 is not formed, is formed to be 1 μm to 1 mm. Thus, warpage occurring in the sealing member 140 and the second heat sink 150b due to a difference in a CTE may be prevented and stress directly applied to the semiconductor chip 110 may be removed.

Also, the second heat sink 150b may be attached to the upper surface of the metal post 170 by using an adhesive (not illustrated) interposed therebetween. The upper surface of the metal post 170 is formed to be exposed to the entire sealing member 140 and then, the second heat sink 150b is attached to the upper surface. Then, the space B is formed between the sealing member 140, where the metal post 170 is not formed, and the second heat sink 150b due to a thickness of the adhesive and thus, warpage occurring in the sealing member 140 and the heat sink 150 due to a difference in a CTE may be prevented. Accordingly, stress directly applied to the semiconductor chip 110 may be removed.

That is, the upper surface of the metal post 170 is formed to be partially exposed through the groove 141 of the sealing member 140 and then, the second heat sink 150b may be attached to the upper surface. Also, the upper surface of the metal post 170 is formed to be exposed to the entire sealing member 140 and then, the second heat sink 150b may be attached to the upper surface.

Here, the adhesive may be conductive or non-conductive and may include any one of Al2O3, AlN, and Si3N4, or PI.

In addition, instead of the adhesive, a plated layer (not illustrated) may be formed on the surface of the second heat sink 150b and the plated layer is attached to the upper surface of the metal post 170 by soldering or sintering. Then, the space B is formed between the entire sealing member 140 and the second heat sink 150b, where the metal post 170 is not formed, due to a thickness of the plated layer, and thus, warpage occurring in the sealing member 140 and the second heat sink 150b due to a difference in a CTE may be prevented. Accordingly, stress directly applied to the semiconductor chip 110 may be removed.

Although not illustrated in the drawing, as in the same manner as in another embodiment described in FIGS. 5A and 5B, the upper surface of at least one metal post 170 is partially formed to be exposed in a hollow form through the groove 141 toward one side of the sealing member 140 and thereby, a terminal used in electrical connection may be easily secured through the metal post 170 without the second heat sink 150b.

As described above, the spaces A and B may be filled with an insulated material or an uninsulated material.

Hereinafter, a method of manufacturing the semiconductor package having an exposed heat sink for high thermal conductivity according to the first, second, and third embodiments will be described in fourth, fifth, and sixth embodiments of the present invention and the same elements and descriptions in the embodiments described above will be omitted below.

Figure 7B:
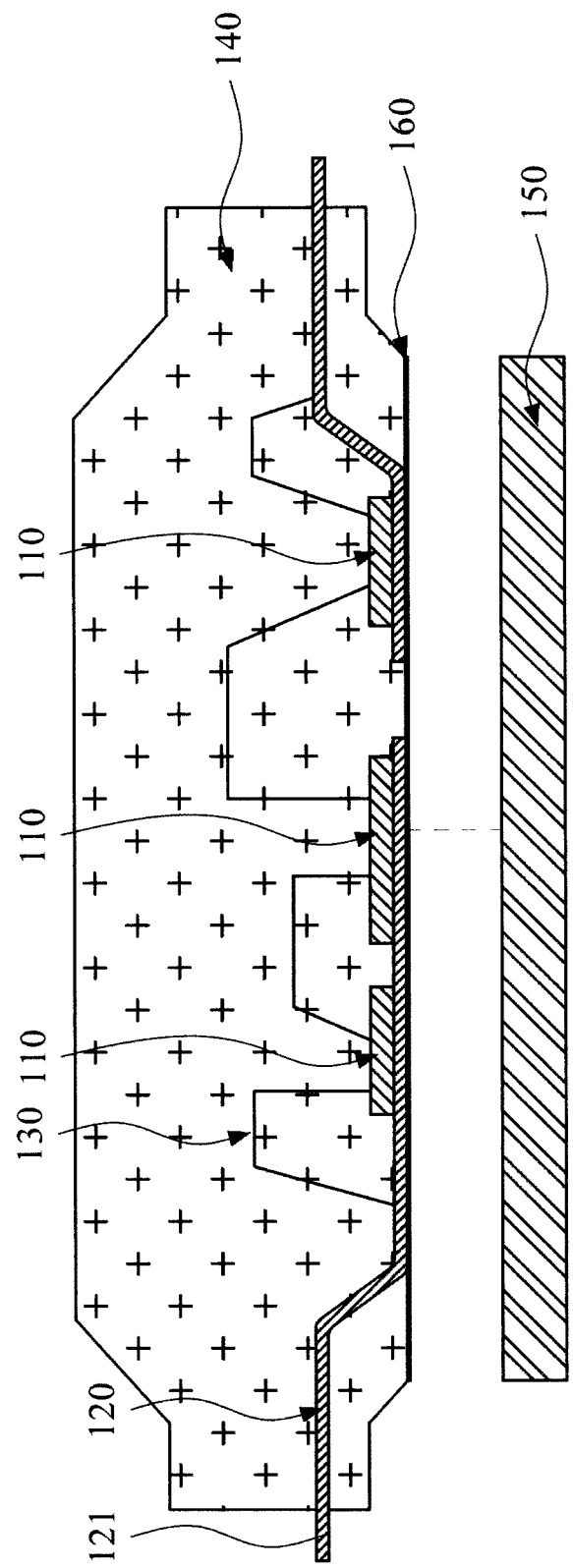

Referring to FIGS. 7A and 7B, the method of manufacturing the semiconductor package having an exposed heat sink for high thermal conductivity according to another embodiment of the present invention includes preparing at least one semiconductor chip 110, attaching the semiconductor chip 110 to the first surface of the lead frame 120, wherein the lead frame 120 has the first surface and the second surface facing the first surface, connecting the signal line 130 to electrically connect the semiconductor chips 110 and semiconductor chip 110 to the lead frame 120, forming the sealing member 140 for surrounding areas where the semiconductor chips 110 are attached, except for the external connection terminal 121 of the lead frame 120, so that the second surface of the lead frame 120 is exposed, and attaching at least one heat sink 150 to the second surface of the lead frame 120. Here, the space A is interposed between the sealing member 140 and the heat sink 150 which face each other, and the heat sink 150 is attached to the second surface of the lead frame 120 after molding of the sealing member 140. Accordingly, the sealing member 140 and the heat sink 150 may be prevented from being warped and thus, stress directly applied to the semiconductor chip 110 is removed. Therefore, reliability and electrical characteristics may be stably secured, and a terminal used in electrical connection may be easily secured through the lead frame 120 exposed to the outside of the sealing member 140.

As illustrated in FIG. 7A, a distance of the space A interposed between the inner wall of the groove 141 of the sealing member 140 and the heat sink 150 is formed to be 10 μm to 5 mm and thus, warpage occurring in the sealing member 140 and the heat sink 150 due to a difference in a CTE may be prevented. Accordingly, stress directly applied to the semiconductor chip 110 may be removed.

Also, as illustrated in FIG. 7B, the heat sink 150 may be attached on the pad of the lead frame 120 by using the adhesive 160 interposed therebetween. The second surface of the lead frame 120 is formed to be exposed to the entire sealing member 140 and then, the heat sink 150 is attached to the second surface. Then, the space B is formed between the sealing member 140, where the pad of the lead frame 120 is not formed, and the heat sink 150 due to a thickness of the adhesive 160 and thus, warpage occurring in the sealing member 140 and the heat sink 150 due to a difference in a CTE may be prevented. Accordingly, stress directly applied to the semiconductor chip 110 may be removed.

Referring to FIGS. 8A and 8B, the method of manufacturing the semiconductor package having an exposed heat sink for high thermal conductivity according to another embodiment of the present invention includes preparing at least one semiconductor chip 110, attaching the semiconductor chip 110 to the first surface of the lead frame 120, wherein the lead frame 120 has the first surface and the second surface facing the first surface, attaching at least one metal post 170 on the semiconductor chips 110 for electrical connection, connecting the signal line 130 to electrically connect the semiconductor chips 110 to the lead frame 120, forming the sealing member 140 for surrounding areas where the semiconductor chips 110 are attached, except for the external connection terminal 121 of the lead frame 120, so that the second surface of the lead frame 120 and the upper surfaces of the metal posts 170 are exposed, and respectively attaching both sides of at least one heat sink 150 to the second surface of the lead frame 120 and the upper surface of the metal post 170. Here, the space A is interposed between the sealing member 140 and the heat sink 150 which face each other, and the heat sinks 150 are respectively attached to the second surface of the lead frame 120 and the upper surface of the metal post 170 after molding of the sealing member 140. Accordingly, the sealing member 140 and the heat sink 150 may be prevented from being warped and thus, stress directly applied to the semiconductor chip 110 is removed. Therefore, reliability and electrical characteristics may be stably secured, and a terminal used in electrical connection may be easily secured through the lead frame 120 exposed to the outside of the sealing member 140.

As illustrated in FIG. 8A, the heat sink 150 may be directly attached on the pad of the lead frame 120 and the upper surface of the metal post 170. Here, the second surface of the lead frame 120 and the upper surface of the metal post 170 are partially exposed through the groove 141 of the sealing member 140 and then, the heat sink 150 may be attached to the second surface of the lead frame 120 and the upper surface of the metal post 170.

Also, as illustrated in FIG. 8B, the heat sink 150 may be attached on the pad of the lead frame 120 and the upper surface of the metal post 170 by using an adhesive (not illustrated) interposed therebetween. The second surface of the lead frame 120 and the upper surface of the metal post 170 are formed to be exposed to the entire sealing member 140 and then, the heat sink 150 is attached to the second surface and the upper surface. Then, the space B is formed between the sealing member 140, where the pad of the lead frame 120 and the metal post 170 are not formed, and the heat sink 150 due to a thickness of the adhesive 160 and thus, warpage occurring in the sealing member 140 and the heat sink 150 due to a difference in a CTE may be prevented. Accordingly, stress directly applied to the semiconductor chip 110 may be removed.

Figure 9A:
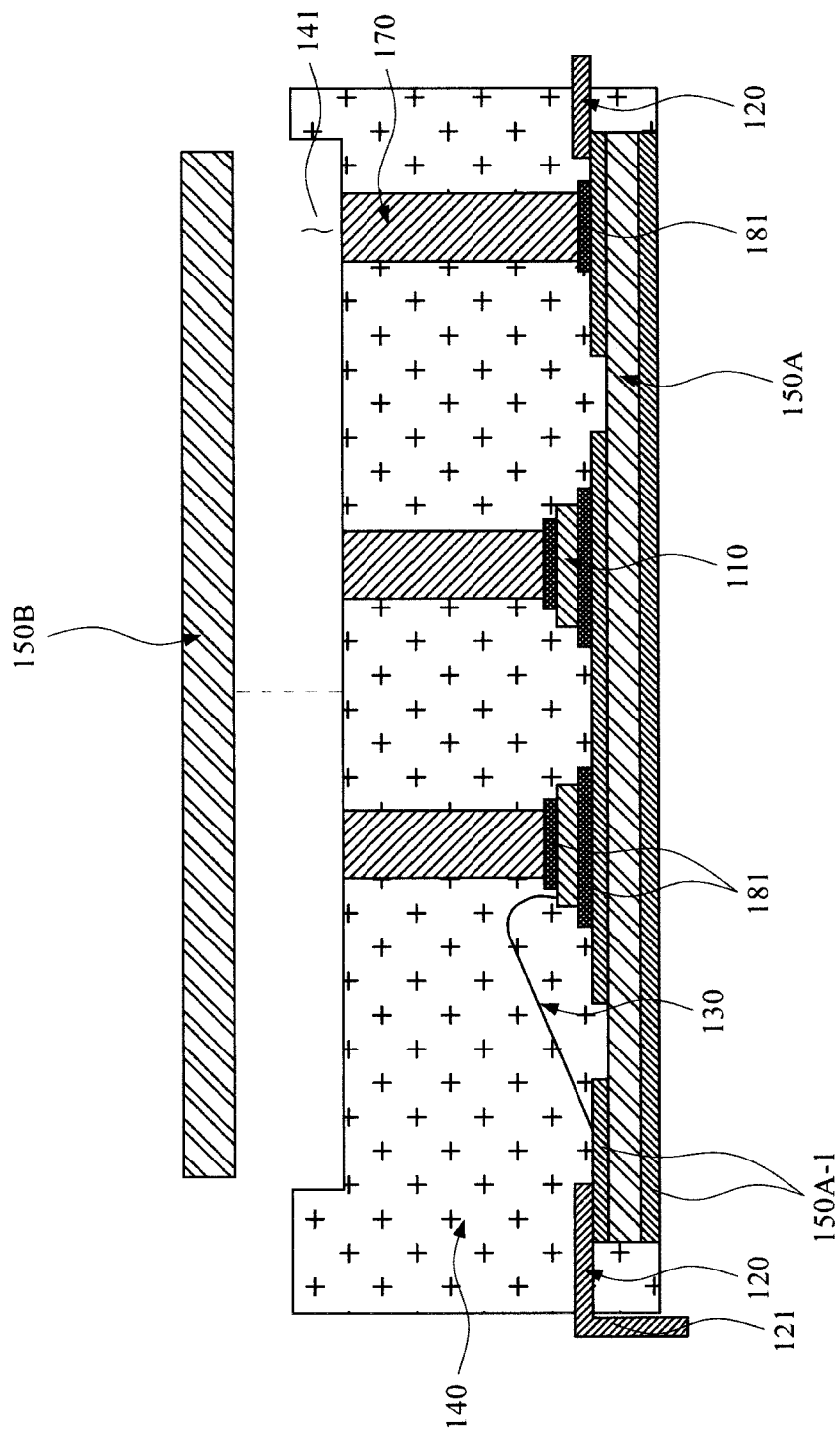
FIGS. 9A and 9B illustrate a method (sixth embodiment) of manufacturing a semiconductor package having an exposed heat sink for high thermal conductivity according to another embodiment of the present invention.
Figure 9B:
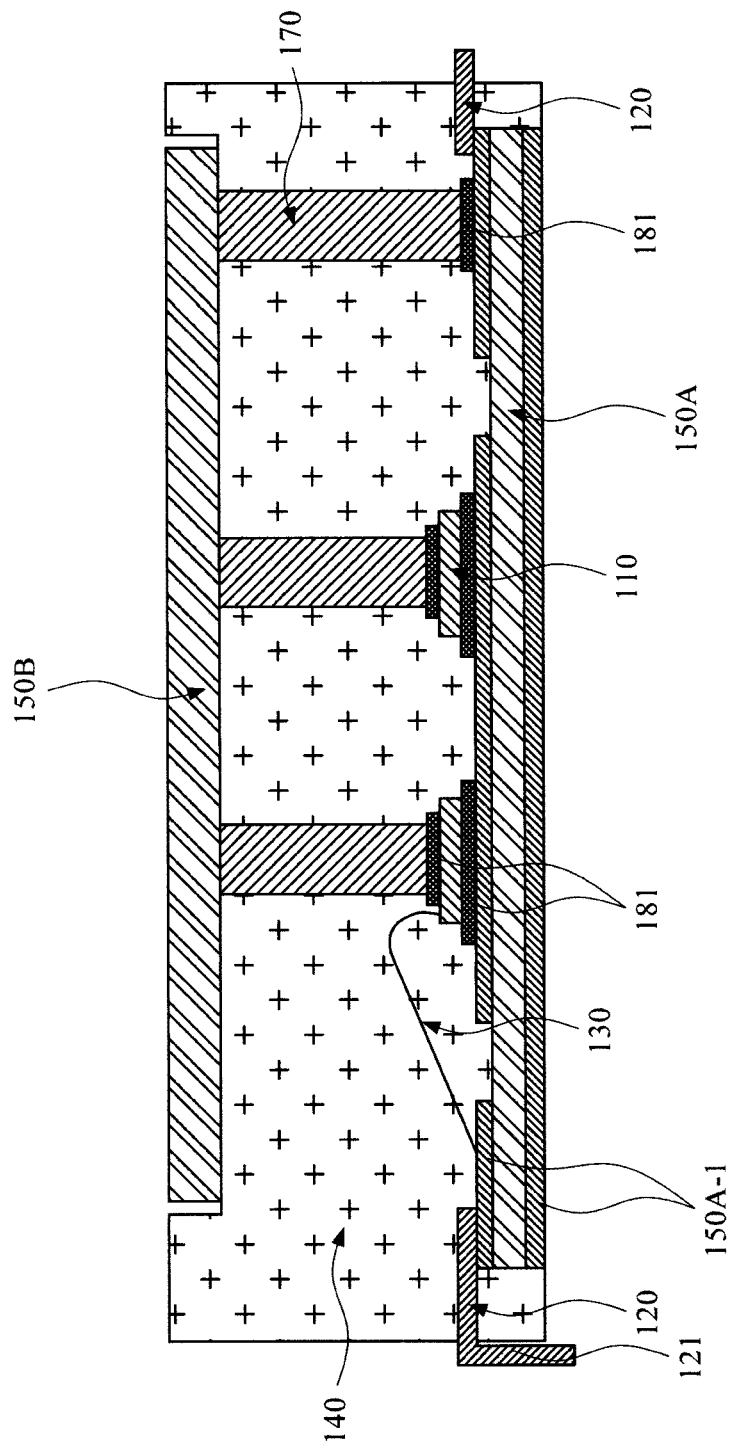

Referring to FIGS. 9A and 9B, the method of manufacturing the semiconductor package having an exposed heat sink for high thermal conductivity according to another embodiment of the present invention includes preparing at least one semiconductor chip 110, attaching the semiconductor chip 110 to the first surface of first heat sink 150a, wherein the first heat sink 150a has the first surface and the second surface facing the first surface, connecting the first heat sink 150a to the lead frame 120, attaching at least one metal post 170 on the semiconductor chips 110 for electrical connection, connecting the signal line 130 to electrically connect the semiconductor chip 110 to the lead frame 120, forming the sealing member 140 for surrounding areas excluding the first heat sink 150a, on which the semiconductor chip 110 is attached, and the external connection terminal 121 of the lead frame 120 so that the upper surfaces of the metal posts 170 are exposed, and attaching at least one second heat sink 150b to the upper surfaces of the metal posts 170. Here, the spaces A and B are interposed between the sealing member 140 and the second heat sink 150b which face each other, the first heat sink 150a is attached to the semiconductor chip 110 before molding of the sealing member 140, and the second heat sink 150b is attached to the upper surface of the metal post 170 after molding of the sealing member 140. Accordingly, the sealing member 140 and the second heat sink 150b may be prevented from being warped and thus, stress directly applied to the semiconductor chip 110 is removed. Therefore, reliability and electrical characteristics may be stably secured, a terminal used in electrical connection may be easily secured through the lead frame 120 exposed to the outside of the sealing member 140, and inspection on defects may be available through scanning of the semiconductor package before attaching the second heat sink 150b after molding.

Therefore, differently from the conventional art, the semiconductor package having an exposed heat sink for high thermal conductivity and the method thereof according to the present invention described above are formed in such a way that the heat sinks are attached as a form of a board and are formed to be exposed to one side or both sides of the upper and lower part of the semiconductor package and then, the heat sinks are attached after molding of the sealing member. Thus, the semiconductor package may be prevented from being deformed, reliability and electrical characteristics may be stably secured, a terminal used in electrical connection may be easily secured through the lead frame exposed to the outside of the sealing member, the heat sinks are directly attached to the lead frame or the metal posts so as to increase heat emission effect, the heat sinks are respectively attached before and after molding of the sealing member, and thereby, inspection on defects may be available through scanning of the semiconductor package before attaching the heat sinks after molding.

According to the present invention, the heat sinks are attached as a form of a board and are formed to be exposed to one side or both sides of the upper and lower part of the semiconductor package and then, the heat sinks are attached after molding of the sealing member. Therefore, the semiconductor package may be prevented from being deformed, reliability and electrical characteristics may be stably secured, and a terminal used in electrical connection may be easily secured through the lead frame exposed to the outside of the sealing member.

Also, the heat sinks are directly attached to the lead frame or the metal posts so that heat emission effect may be improved.

In addition, the heat sinks are respectively attached before and after molding of the sealing member, and thereby, inspection on defects may be available through scanning of the semiconductor package before attaching the heat sinks after molding.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package having an exposed heat sink for high thermal conductivity comprising:
    at least one semiconductor chip;
    a lead frame comprising a first surface, to which the semiconductor chips are attached, and a second surface facing the first surface;
    a signal line for electrically connecting the semiconductor chips and the semiconductor chip to the lead frame;
    a sealing member for surrounding areas where the semiconductor chips are attached, except for an external connection terminal of the lead frame, so that the second surface of the lead frame is exposed; and
    at least one heat sink attached to the second surface of the lead frame,
wherein the sealing member and the heat sink comprise a space interposed therebetween and the heat sink is attached to the second surface of the lead frame after molding of the sealing member.

2. The semiconductor package having an exposed heat sink for high thermal conductivity of claim 1, wherein the heat sink is an insulator board, a conductive board comprising 50% or more metal components, a conductive or non-conductive tape form, or a paste form to be cured at high temperature of above 100° C. and hardened.

3. The semiconductor package having an exposed heat sink for high thermal conductivity of claim 1, wherein the heat sink comprises an adhesive so as to be attached to the lead frame.

4. The semiconductor package having an exposed heat sink for high thermal conductivity of claim 1, wherein the second surface of the lead frame is partially exposed through a groove of the sealing member or formed to be exposed to the entire sealing member and then, the heat sink is attached to the second surface of the lead frame.

5. The semiconductor package having an exposed heat sink for high thermal conductivity of claim 4, wherein a distance of the space interposed between an inner wall of the groove of the sealing member and the heat sink is 10 μm to 5 mm, a distance of the space interposed between the entire sealing member and the heat sink is 1 μm to 1 mm, and the spaces are filled with an insulated material or an uninsulated material.

6. The semiconductor package having an exposed heat sink for high thermal conductivity of claim 1, wherein the second surface of the lead frame is partially exposed at one side of the sealing member in a hollow form.

7. The semiconductor package having an exposed heat sink for high thermal conductivity of claim 1, wherein the heat sink comprises a plated layer on the surface thereof, and the plated layer is attached to the second surface of the lead frame by soldering or sintering.

8. A semiconductor package having an exposed heat sink for high thermal conductivity comprising:
    at least one semiconductor chip;
    a lead frame comprising a first surface, to which the semiconductor chips are attached, and a second surface facing the first surface;
    at least one metal post attached on the semiconductor chips for electrical connection;
    a signal line for electrically connecting the semiconductor chip to the lead frame;
    a sealing member for surrounding areas where the semiconductor chips are attached, except for an external connection terminal of the lead frame, so that the second surface of the lead frame and the upper surface of the metal post are exposed; and
    at least one heat sink, wherein both sides thereof are respectively attached to the second surface of the lead frame and the upper surface of the metal post,
wherein the sealing member and the heat sink comprise a space interposed therebetween and the heat sink is respectively attached to the second surface of the lead frame and the upper surface of the metal post after molding of the sealing member.

9. The semiconductor package having an exposed heat sink for high thermal conductivity of claim 8, wherein the heat sink is an insulator board, a conductive board comprising 50% or more metal components, a conductive or non-conductive tape form, or a paste form to be cured at high temperature of above 100° C. and hardened.

10. The semiconductor package having an exposed heat sink for high thermal conductivity of claim 8, wherein the heat sink comprises an adhesive so as to be respectively attached to the lead frame and the metal post.

11. The semiconductor package having an exposed heat sink for high thermal conductivity of claim 8, wherein the second surface of the lead frame and the upper surface of the metal post are partially exposed through a groove of the sealing member or formed to be exposed to the entire sealing member and then, the heat sink is attached to the second surface of the lead frame and the upper surface of the metal post.

12. The semiconductor package having an exposed heat sink for high thermal conductivity of claim 11, wherein a distance of the space interposed between an inner wall of the groove of the sealing member and the heat sink is 10 μm to 5 mm, a distance of the space interposed between the entire sealing member and the heat sink is 1 μm to 1 mm, and the spaces are filled with an insulated material or an uninsulated material.

13. The semiconductor package having an exposed heat sink for high thermal conductivity of claim 8, wherein the second surface of the lead frame is partially exposed at one side of the sealing member in a hollow form.

14. The semiconductor package having an exposed heat sink for high thermal conductivity of claim 8, wherein the upper surfaces of the at least one metal post are partially exposed to one side of the sealing member.

15. The semiconductor package having an exposed heat sink for high thermal conductivity of claim 8, wherein the heat sink comprises a plated layer on the surface thereof, and the plated layer is attached to the second surface of the lead frame and the upper surface of the metal post by soldering or sintering.

16. A semiconductor package having an exposed heat sink for high thermal conductivity comprising:
    at least one semiconductor chip;
    a first heat sink comprising a first surface, to which the semiconductor chips are attached, and a second surface facing the first surface;
    a lead frame connected to the first heat sink;
    at least one metal post attached on the semiconductor chips for electrical connection;
    a signal line for electrically connecting the semiconductor chip to the lead frame;
    a sealing member for surrounding areas excluding the first heat sink, on which the semiconductor chip is attached, and an external connection terminal of the lead frame so that the upper surface of the lead frame is exposed; and
    at least one second heat sink attached to the upper surface of the metal post,
wherein the sealing member and the second heat sink comprise a space interposed therebetween so as to face each other, the first heat sink is attached to the semiconductor chip before molding of the sealing member, and the second heat sink is attached to the upper surface of the metal post after molding of the sealing member.

17. The semiconductor package having an exposed heat sink for high thermal conductivity of claim 16, wherein the first and second heat sinks are respectively an insulator board, a conductive board comprising 50% or more metal components, a conductive or non-conductive tape form, or a paste form to be cured at high temperature of above 100° C. and hardened.

18. The semiconductor package having an exposed heat sink for high thermal conductivity of claim 16, wherein the first and second heat sinks comprise an adhesive so as to be attached to the metal post and the semiconductor chip.

19. The semiconductor package having an exposed heat sink for high thermal conductivity of claim 16, wherein the upper surface of the metal post is partially exposed through a groove of the sealing member or formed to be exposed to the entire sealing member and then, the second heat sink is attached to the upper surface of the metal post.

20. The semiconductor package having an exposed heat sink for high thermal conductivity of claim 16, wherein the upper surfaces of the at least one metal post are partially exposed to one side of the sealing member.

21. The semiconductor package having an exposed heat sink for high thermal conductivity of claim 19, wherein a distance of the space interposed between an inner wall of the groove of the sealing member and the second heat sink is 10 µm to 5 mm, a distance of the space interposed between the entire sealing member and the second heat sink is 1 µm to 1 mm, and the spaces are filled with an insulated material or an uninsulated material.

\* \* \* \* \*